(12) United States Patent
Huang et al.

(10) Patent No.: US 7,944,668 B2
(45) Date of Patent: May 17, 2011

(54) CONNECTION APPARATUS WITH HIGH VOLTAGE IMPULSE PROTECTION

(75) Inventors: Chien-Hsiang Huang, Taipei Hsien (TW); Muh-Jin Uang, Taipei Hsien (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 1163 days.

(21) Appl. No.: 11/651,449

(22) Filed: Jan. 10, 2007

(65) Prior Publication Data

US 2008/0037192 A1 Feb. 14, 2008

(30) Foreign Application Priority Data

Aug. 14, 2006 (TW) .............................. 95129763 A

(51) Int. Cl.
- *H02H 3/22* (2006.01)
- *H02H 1/00* (2006.01)
- *H02H 1/04* (2006.01)
- *H02H 9/06* (2006.01)
- *H01C 7/12* (2006.01)

(52) U.S. Cl. .......... 361/111; 361/117; 361/118; 361/120

(58) Field of Classification Search .................. 361/111, 361/117–118, 120

See application file for complete search history.

(56) References Cited

U.S. PATENT DOCUMENTS

| | | | | |
|---|---|---|---|---|
| 5,995,353 | A | * | 11/1999 | Cunningham et al. ........ 361/111 |
| 6,541,878 | B1 | * | 4/2003 | Diab .............................. 307/17 |
| 7,458,856 | B2 | * | 12/2008 | Ferentz ................... 439/620.23 |
| 2002/0001160 | A1 | | 1/2002 | Berberich |
| 2004/0027779 | A1 | | 2/2004 | Byrne et al. |
| 2005/0164558 | A1 | | 7/2005 | Ferentz |
| 2005/0243496 | A1 | | 11/2005 | Harris |

FOREIGN PATENT DOCUMENTS

JP    2003-533013 A    11/2003

* cited by examiner

*Primary Examiner* — Dharti H Patel
(74) *Attorney, Agent, or Firm* — Birch, Stewart, Kolasch & Birch, LLP

(57) ABSTRACT

Connection apparatuses are provided, in which at least one isolation transformer comprises a primary coil and a secondary coil each comprising a first end, a second end and a tap, and a high voltage impulse protector is disposed between the primary coil of the isolation transformer and a ground terminal, discharging an overcurrent caused by a high voltage impulse to the ground terminal by point discharge when a high voltage impulse event occurs.

19 Claims, 9 Drawing Sheets

CONNECTION APPARATUS WITH HIGH VOLTAGE IMPULSE PROTECTION

BACKGROUND OF THE INVENTION

1. Field of the Invention

The invention relates to a connection apparatus, and more particularly to a connection apparatus with high voltage impulse protection.

2. Description of the Related Art

Whenever electronic circuitry is coupled to an external cable run there is a risk of damage to the circuit, due to the transmission of transient overvoltages by the cable run. Transient overvoltages may be due to any one of several factors. For example, lightning, electrostatic discharge, or malfunctioning equipment at a remote end of the cable may be responsible. Several techniques exist for isolating circuitry from potentially damaging surges.

FIG. 1 is a schematic diagram of a conventional network connector. As shown, the network connector 100 provides high voltage impulse protection (also referred to as lightening or surge protection) between signal lines by transient voltage suppressor (TVS) diodes 10A~10D and provides high voltage impulse protection between signal lines and a ground terminal by coupling resistors R1~R4 and a capacitor CH to the pins TX+, TX−, RX+ and RX−.

The described method, however, has the following disadvantages. Energy caused the high voltage impulse may discharge to other components as the resistors have a large volume. To sustain the discharged energy, however, the volume of the resistors must be sufficiently large. Further, in order provided optimum isolation for a component, isolation glue must be coated on the printed circuit board, reducing yield and increasing time-to-market.

The currents through the each resistor may also be different due to resistance error in the resistors, such that the resistor with a relative smaller resistance may bear a larger current and thus be damaged. Total cost increases with the total number of resistors used. The resistors may age due to lightening. Additionally, there is no lightening protection for the secondary coils (TL3 and TL4), and thus, interference with the core of the system by lightening is not preventable. Typical integrated circuits are not capable of sustaining high voltage and although the primary coils (TL1 and TL2) isolate most discharged energy, a voltage of several tens of volts is still induced in the secondary coils and the motherboard may be damaged accordingly.

BRIEF SUMMARY OF THE INVENTION

A detailed description is given in the following embodiments with reference to the accompanying drawings.

Connection apparatuses are provided. An exemplary embodiment of a connection apparatus comprises at least one isolation transformer comprising a primary coil and a secondary coil. Each primary coil and secondary coil comprises a first end, a second end and a tap. A high voltage impulse protector is disposed between the primary coil of the isolation transformer and a ground terminal for discharging an overcurrent caused by a high voltage to the ground terminal by point discharge when a high voltage impulse event occurs.

Another embodiment of connection apparatus comprises a socket with a slot disposed on a circuit board. The slot comprises a plurality of pins and a high voltage impulse protector is disposed between the pins of the slot and a ground terminal for discharging an overcurrent caused by a high voltage to the ground terminal by point discharge when a high voltage impulse event occurs.

High voltage impulse protection methods for a connection apparatus are provided. An exemplary embodiment of a high voltage impulse protection method for a connection apparatus comprises a slot disposed on a circuit board, in which the slot has a plurality of pins. In the method, a high voltage impulse protector is disposed between the pins of the slot and a ground terminal to discharge overcurrent generated by a high voltage impulse to the ground terminal by point discharge when a high voltage impulse event occurs.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In a space with high surface curvature (such as a tip), the surrounding air may be dissociated to generate gas discharge, known as point discharge, when electric field strength increases acutely. The invention utilizes point discharge to discharge energy from high voltage impulse on all pins (connected to the primary coil) to the ground terminal by a capacitor when a high voltage impulse event occurs.

Figure 1:
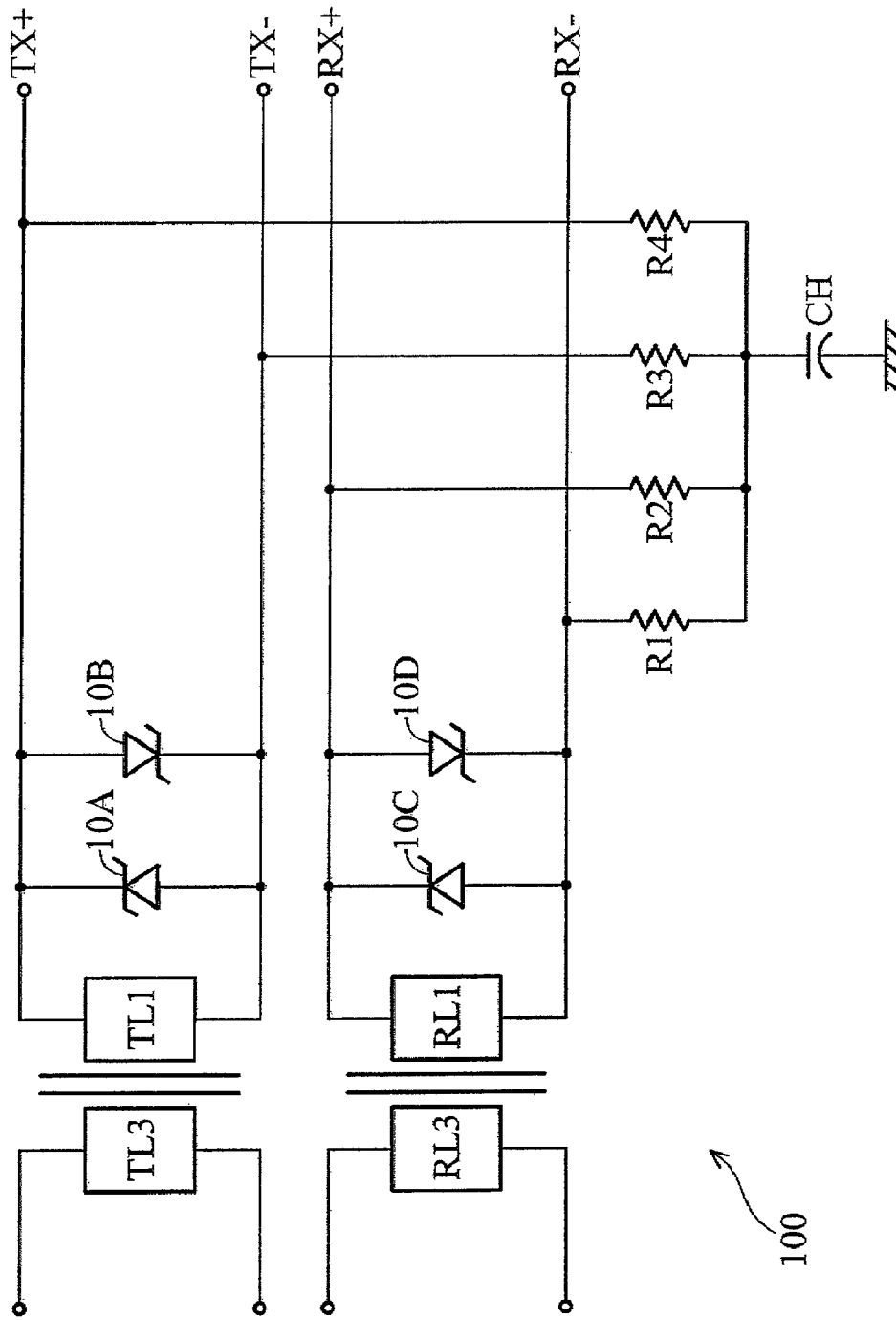
FIG. 1 is a schematic diagram of a conventional network connector.
Figure 2:
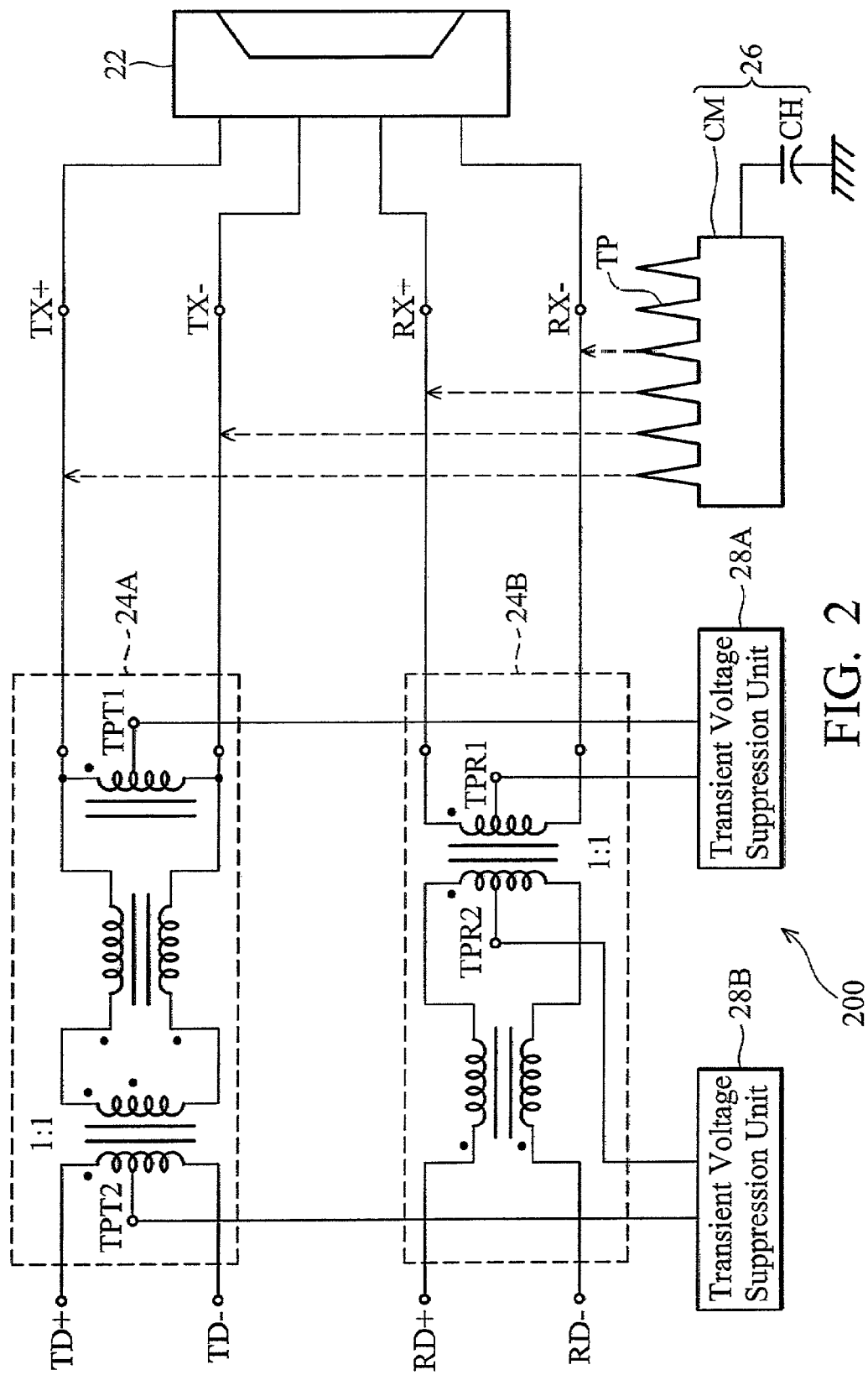
FIG. 2 shows an embodiment of a connection apparatus.

FIG. 2 shows an embodiment of a connection apparatus. As shown, a connection apparatus 200 comprises a slot 22, two isolation transformers 24A and 24B, a high voltage impulse protector 26 and two transient voltage suppression units 28A and 28B. In this embodiment, the connection apparatus 200 can be a network connector but is not limited thereto.

The slot 22 is coupled between an external network cable (not shown) and the isolation transformers 24A and 24B and comprises a plurality of pins TX+, TX−, RX+ and RX−. For example, the slot 22 can be disposed on a circuit board 29 (shown in FIG. 3) by dual-in-line package (DIP) technology.

The isolation transformers 24A and 24B both comprise a primary coil and a secondary coil, in which the primary coil and the secondary coil each has a first end, a second end and a tap. The primary coils of the isolation transformers 24A and 24B are coupled to the slot 22 respectively, and the secondary coils of the isolation transformers 24A and 24B are coupled to an external processing circuit (not shown), such as a processing circuit on a local area network (LAN) card or a motherboard, through the connection terminals TD+, TD−, RD+ and RD−. For example, the first and second ends of the primary coil in the isolation transformer 24A are coupled to the pins TX+ and TX−, and the first and second ends of the primary coil in the isolation transformer 24B are coupled to the pins RX+ and RX−.

Figure 3:
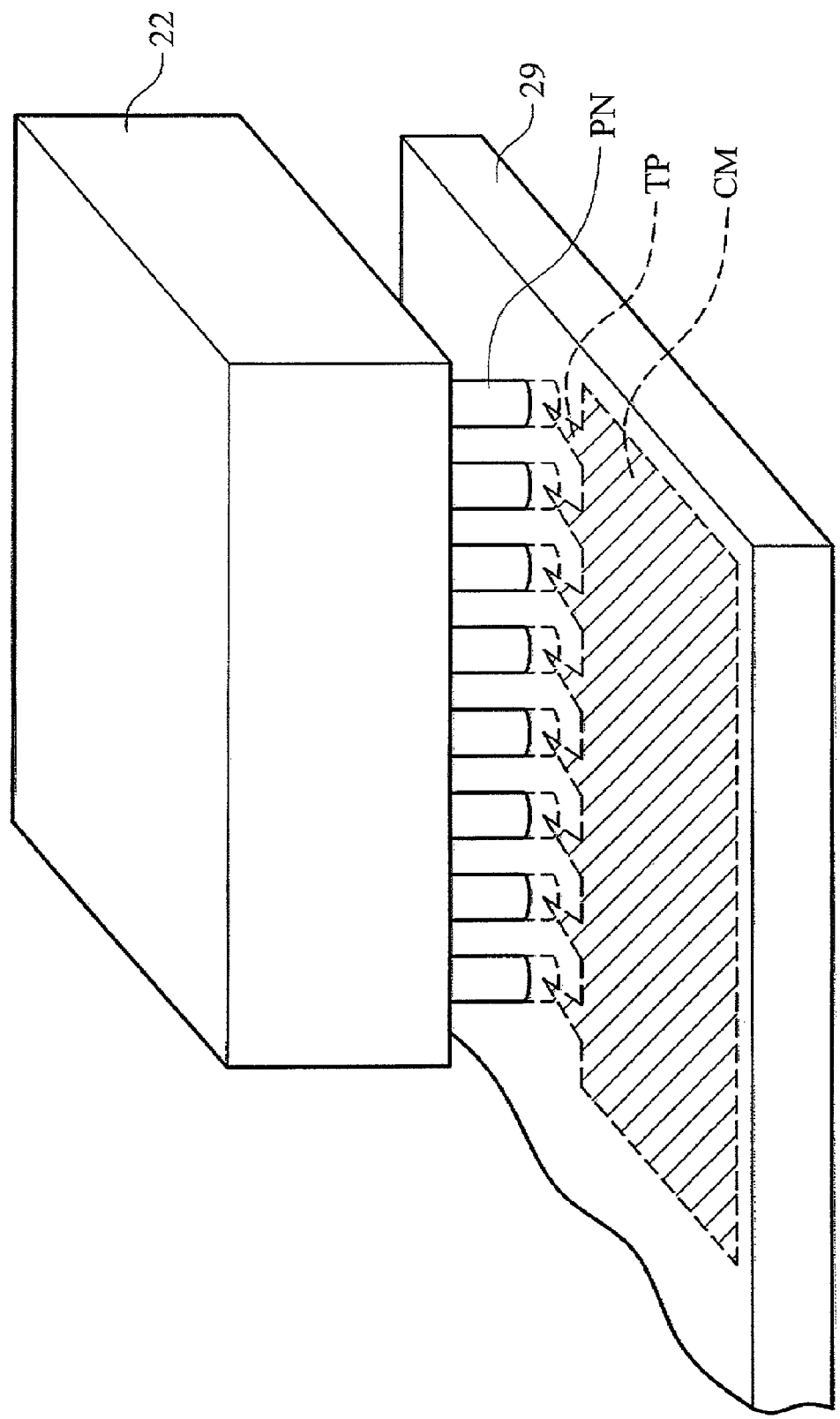
FIG. 3 is a diagram illustrating high voltage impulse protector and a slot in the connection apparatus.

The high voltage impulse protector 26 is disposed between the primary coils of the isolation transformers 24A and 24B and a ground terminal to discharge overcurrent generated by a high voltage impulse the ground terminal by point discharge when a high voltage impulse event occurs. For example, as shown in FIG. 3, the high voltage impulse protector 26 can be a conductive layer CM with a plurality of tips TP aligning with pins of the slot 22 respectively. The conductive layer CM does not connect to the pins of the slot 22 directly and provides high voltage impulse protection between signal lines and the ground terminal by point discharge only when a high voltage impulse event occurs.

Figure 4:
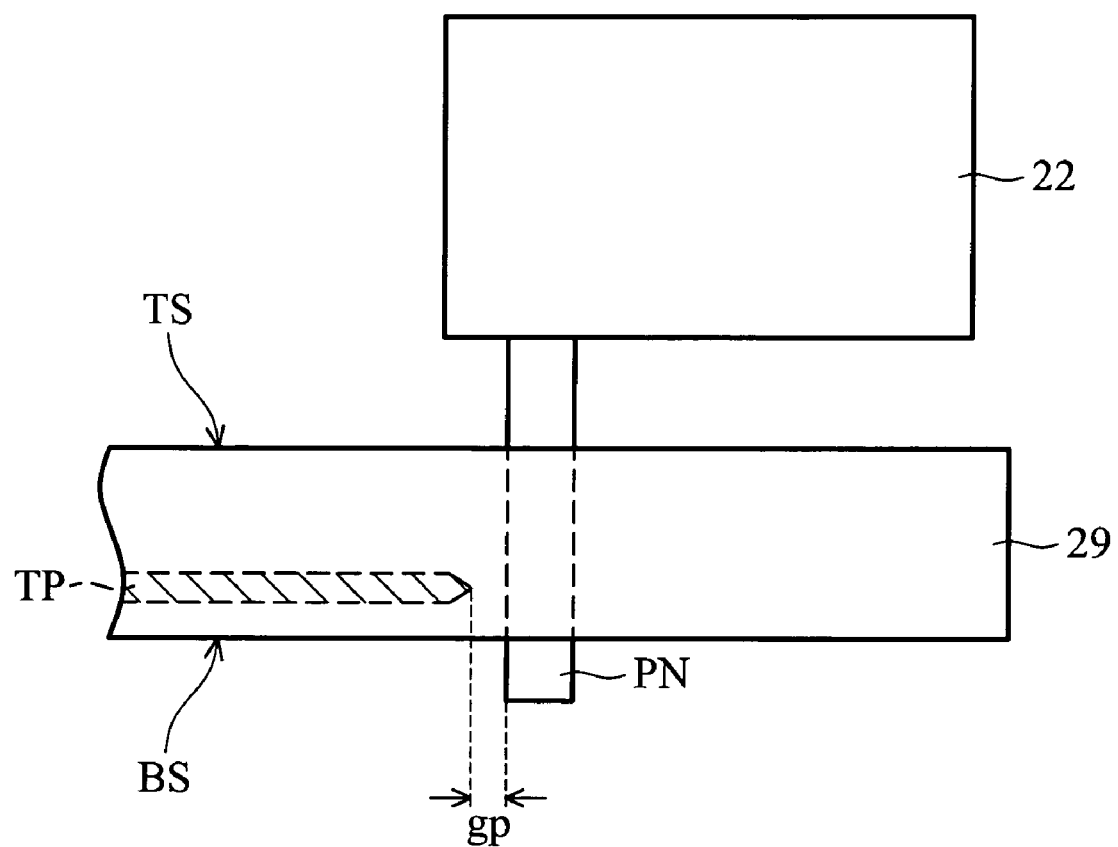
FIG. 4 is another diagram illustrating the high voltage impulse protector and the slot in the connection apparatus.

Namely, when no high voltage impulse event occurs, the high voltage impulse protector 26 and all pins of the slot 22 are not electrically connected, i.e., they are open-circuit. The high voltage impulse protector 26 and the pins of the slot 22 are electrically coupled by point discharge only when a high voltage impulse event occurs. As shown in FIG. 4, the conductive layer CM has a plurality of tips TP separated from pins PN of the slot 22 by a small gap gp, such that the tips TP do not electrically connect directly to the pins PN of the slot 22. Because point discharge is a non-contact design, signals on the pins PN are not affected by aging of the high voltage impulse protector 26 and other elements of the conventional connector can also be prevented. Energy induced by high voltage impulse is discharged to the tips TP by the pins PN connected to the primary coil, electric energy is converted to luminous energy for 0.5-10 ns, and after partial decay, is discharged to the ground terminal by the capacitor.

Because the first end and the second end of the primary coils in the isolation transformers 24A and 24B are electrically coupled to the pins RX+, RX−, TX− and TX+, the high voltage impulse protector 26 discharges an overcurrent caused by a high voltage on the pins RX+, RX−, TX− and TX+ to the ground terminal by point discharge when a high voltage impulse event occurs. Thus, the isolation transformers 24A and 24B and other circuits coupled thereto are protected against high voltage impulse events.

Further, the high voltage impulse protector 26 can further comprise a capacitor CH coupled between the conductive layer CM and the ground terminal, buffering energy generated by the high voltage impulse event and extending discharge time such that the generated energy can be decayed and discharged to the ground terminal. For example, the conductive layer CM can be a metal layer, such as a copper (Cu) layer but it is not limited thereto.

It should be noted that the conductive layer CM shown in FIG. 4 is disposed in the circuit board 29 such that the routing on the circuit board 29 can be simplified, but it is also can be disposed on the top surface TS or bottom surface BS of the circuit board 29.

In some embodiments, the pins of the slot 22 can be connected to the circuit board 29 by plugs when the slot 22 is disposed on the circuit board 29 by surface mount device (SMD) technology. The tips of the high voltage impulse protector 26 can be aligned with the plugs respectively but are not electrically connected directly, thus, high voltage impulse protection is provided between signal lines and the ground terminal by point discharge only when a high voltage impulse event occurs.

As shown in FIG. 2, the transient voltage suppression units 28A is disposed between the taps of the primary coils in the isolation transformer 24A and 24B and the transient voltage suppression units 28B is disposed between the taps of the secondary coils in the isolation transformer 24A and 24B, performing a high voltage impulse protection between signal lines. Namely, transient voltage suppression units 28A and 28B can serve as a voltage-current limiting element for clamping the voltage and the current, or both, induced at the primary coil, or the secondary coils of the isolation transformer 24A and 24B.

For example, the transient voltage suppression units 28A and 28B limit current from pins TX+, TX−, RX+ and RX−, current output from the second ends (TD+, TD−, RD+ and RD−) of the secondary coils, voltages on the pins TX+, TX−, RX+ and RX−, or voltage on the second ends (TD+, TD−, RD+ and RD−) of the secondary coils. Further, the transient voltage suppression units 28A and 28B can comprise series-connected or parallel-connected transient voltage suppressor (TVS) diodes, polydiodes, surge absorbers, varistors, zener diodes or combinations thereof but are not limited thereto.

Figure 5:
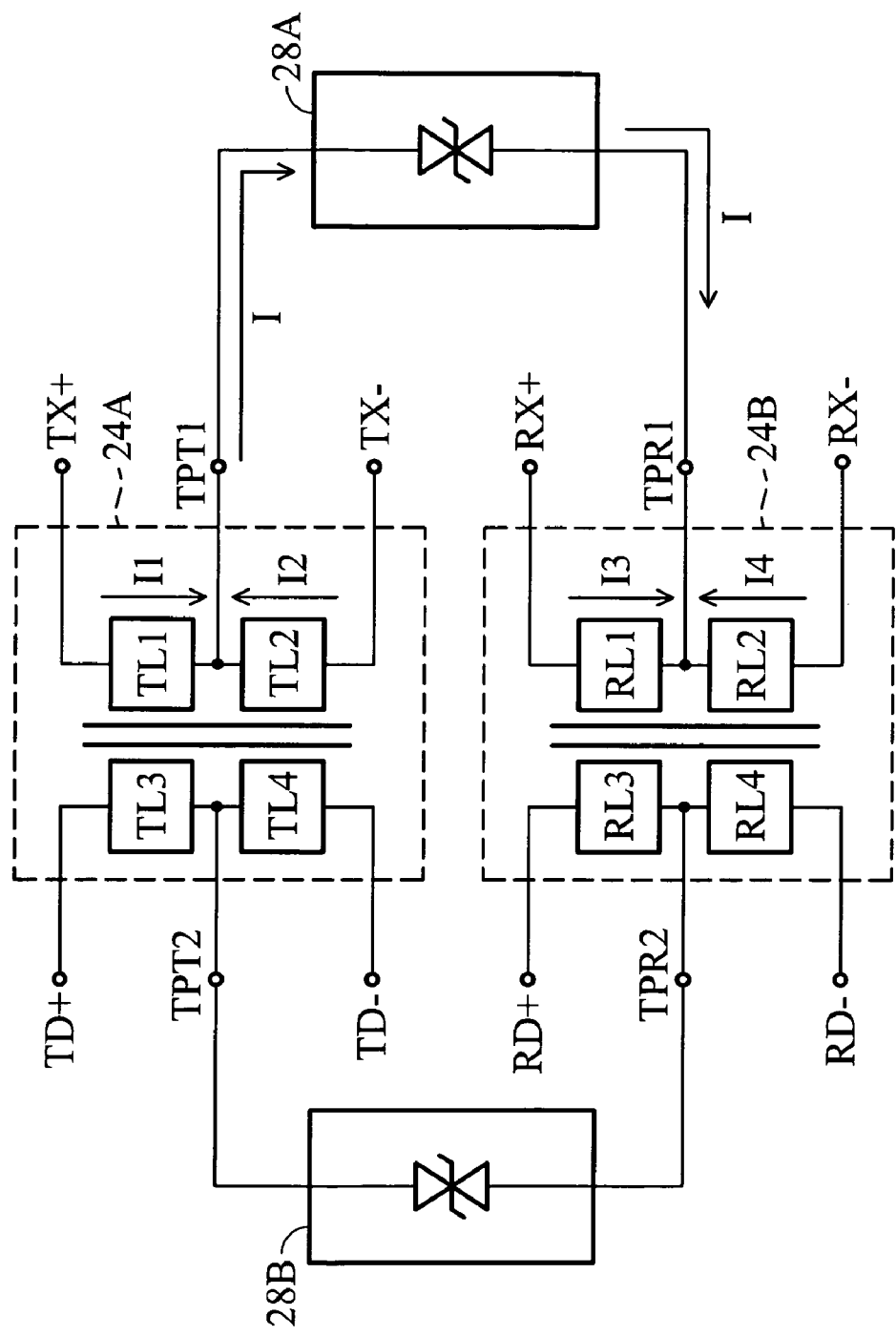
FIG. 5 is a diagram illustrating a isolation transformer and a transient voltage suppression unit in the connection apparatus.

FIG. 5 shows a diagram illustrating the isolation transformers and the transient voltage suppression units. As shown, the primary coil of the isolation transformer 24A comprises a winding TL1 coupled to the pin TX+, a winding TL2 coupled to the pin TX−, and a tap TPT1 coupled to the transient voltage suppression unit 28A. The primary coil of the isolation transformer 24B comprises a winding RL1 coupled to the pin RX+, a winding RL2 coupled to the pin RX−, and a tap RPT1 coupled to the transient voltage suppression unit 28A. The secondary coil of the isolation transformer 24A comprises a winding TL3 coupled to the pin TD+, a winding TL4 coupled to the pin TD−, and a tap TPT2 coupled to the transient voltage suppression unit 28B. The secondary coil of the isolation transformer 24B comprises a winding RL3 coupled to the pin RD+, a winding RL4 coupled to the pin RD−, and a tap RPT2 coupled to the transient voltage suppression unit 28B. In this embodiment, the transient voltage suppression unit 28A and 28B can be transient voltage suppressor (TVS) diodes but it is not limited thereto.

The taps are typically at zero-voltage under normal operation, such that signals on the pins TX+, RX+, RX−, TX−, TD+, RD+, RD− and TD− are not affected by the stray capacitors of the transient voltage suppression units 28A and 28B coupled to the taps.

When a voltage difference is induced between two signal lines by a high voltage impulse event, currents I1 and I2 flow to transient voltage suppression unit 28A from the tap TPT1 between the windings TL1 and TL2 and currents I3 and I4 flow to transient voltage suppression unit 28B from the tap TPT2 between the windings RL1 and RTL2. Namely, I=(I1+I2)=−(I3+I4), and thus, if clamp current of the transient voltage suppression unit 28A is controlled, the branch currents on the windings TL1, TL2, RL1 and RL2 can be controlled effectively and induced currents at the secondary coil can also be suppressed. Similarly, the induced currents at the secondary coil can be clamped by the transient voltage suppression unit 28B coupled to the taps TPT2 and TPR2, such that the branch currents on the windings TL3, TL4, RL3 and RL4 can be limited, forming a second-stage high voltage impulse protection.

Further, when a high voltage impulse event occurs between signal lines and the ground terminal, the transient voltage suppression units 28A and 28B still can limit branch current on each winding or clamp the voltage difference between two taps even if currents or voltages on the pins may be different, such that the circuit board can be protected from the high voltage impulse event.

The connection apparatus of the invention has the following advantages. The discharge path does not couple to signals on the pins, thus, isolation glue is not required, and routing of the circuit board can be simplified. Particularly, because there is no capacitor and resistor coupled to the signals on the pins directly, i.e., the discharge path does not couple signals on the pins, signal decay does not occur. Thus, the connection apparatus can be applied to all high speed network standards without affecting their transmission.

Further, because the resistive elements of conventional connection apparatuses are omitted, discharge noise generated by resistive elements can be prevented, protection units or resistors are not damaged by the voltage difference due to errors between resistors, and aging of the resistive elements due to high voltage impulses can also be prevented. Moreover, occupied space on the printed circuit board and time-to-market can be reduced. In addition, because each transient voltage impulse suppression unit is disposed between two taps, each transient voltage impulse suppression unit can protect four signal lines and transient voltage impulse suppression units disposed at the secondary coil further provide second-stage protection for a mother board against high voltage impulse events.

Figure 6:
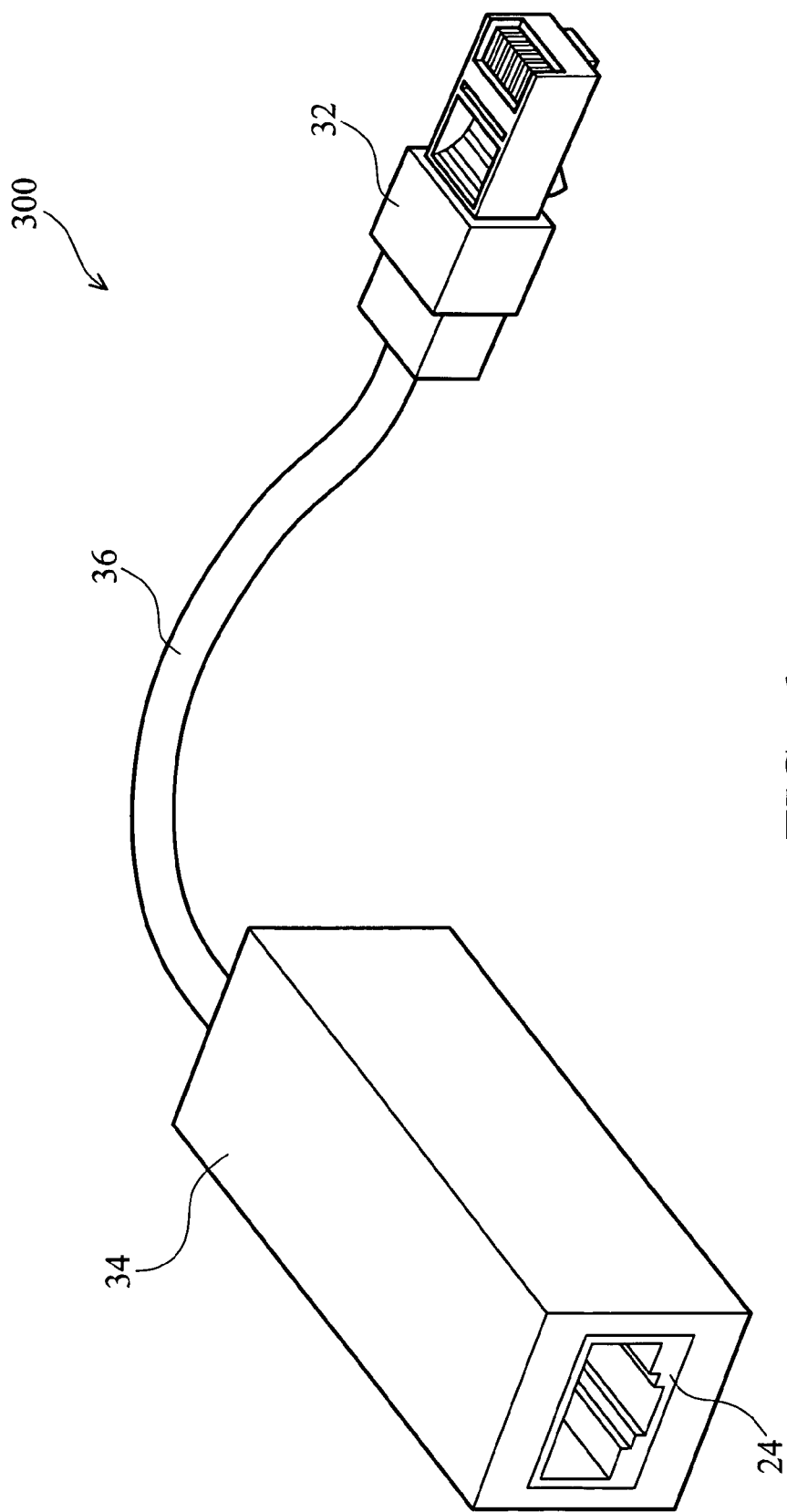
FIG. 6 shows another embodiment of a connection apparatus.
Figure 7:
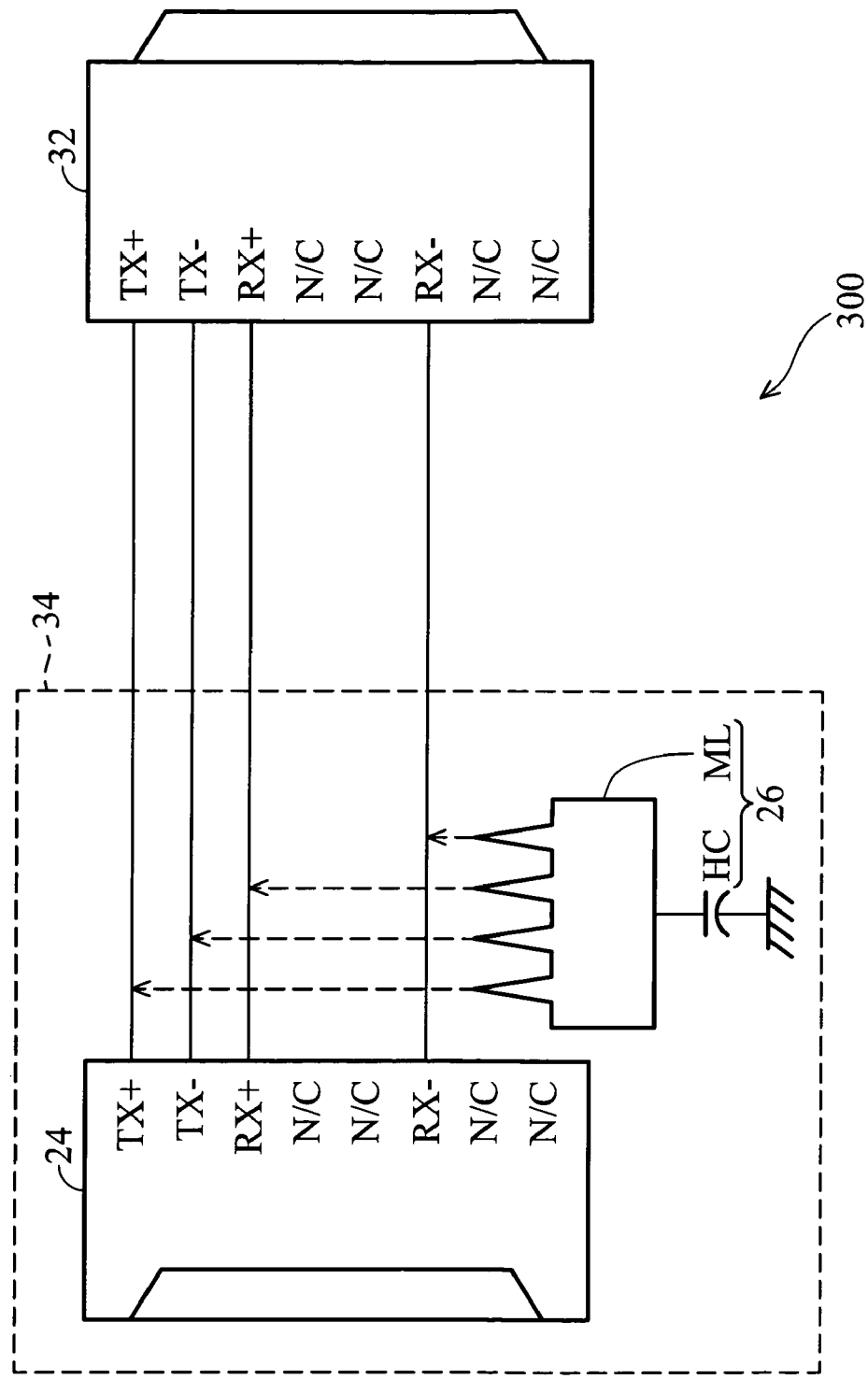
FIG. 7 is a diagram showing the connection apparatus shown in FIG. 6.

FIG. 6 shows another embodiment of a connection apparatus. As shown, a connection apparatus 300 comprises a plug 32 and a socket 34. FIG. 7 is another diagram of the connection apparatus shown in FIG. 6. In this embodiment, the connection apparatus 300 can be a network connector but is not limited thereto.

The plug 32 is coupled to the socket 34 through a cable 36, and the socket 34 comprises the high voltage impulse protector 26 and the slot 22 shown in FIG. 2. The high voltage impulse protector 26 is disposed between the primary coils of the isolation transformers 24A and 24B and a ground terminal to discharge overcurrent generated by a high voltage to the ground terminal by point discharge when a high voltage impulse event occurs. For example, the high voltage impulse protector 26 can be a conductive layer CM with a plurality of tips TP aligning with pins of the slot 22 respectively. Operations of the high voltage impulse protector 26 are similar to those described with reference to FIGS. 2~4, thus, further description thereof is omitted for brevity.

Figure 8A:
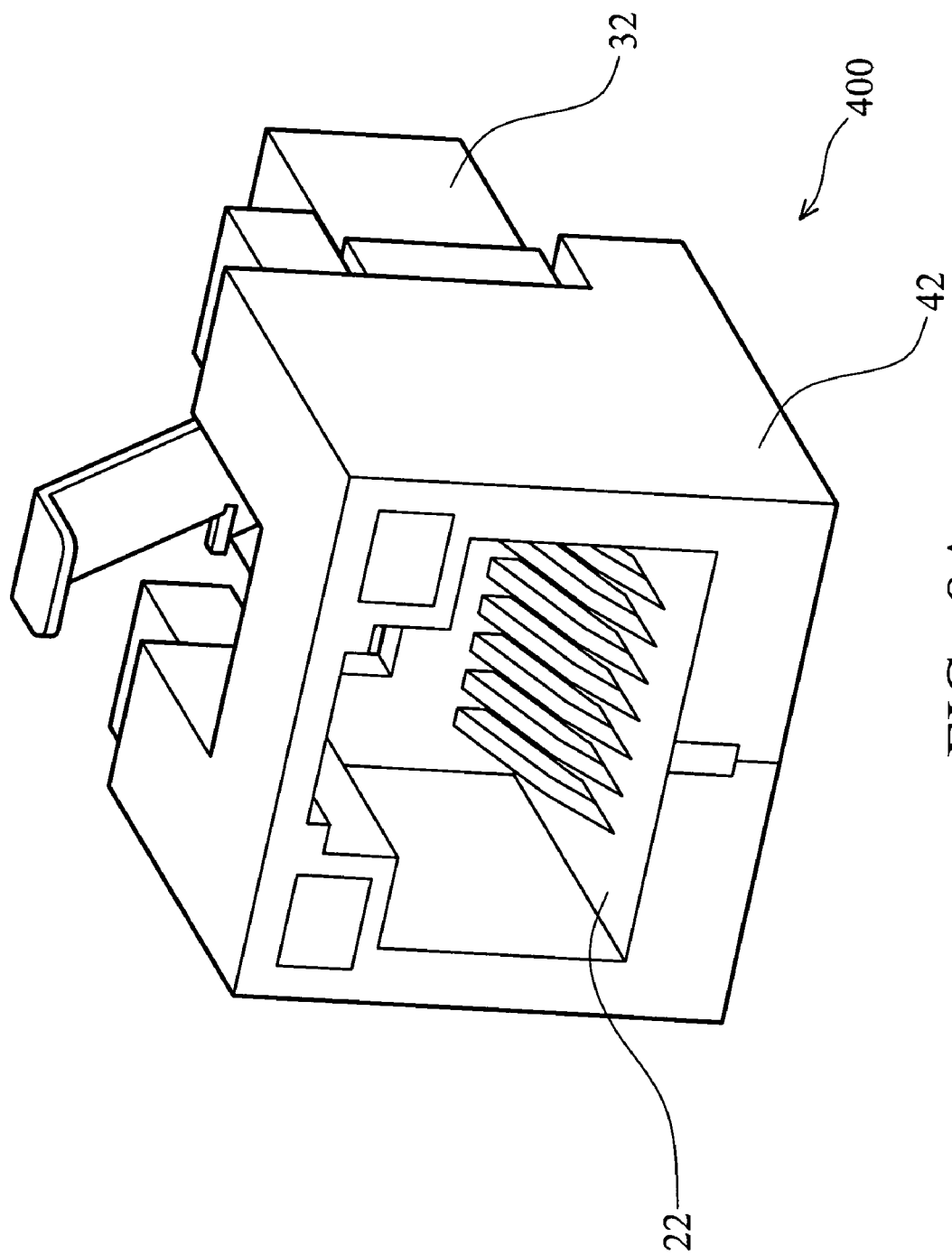
FIGS. 8A and 8B show another embodiment of a connection apparatus.
Figure 8B:
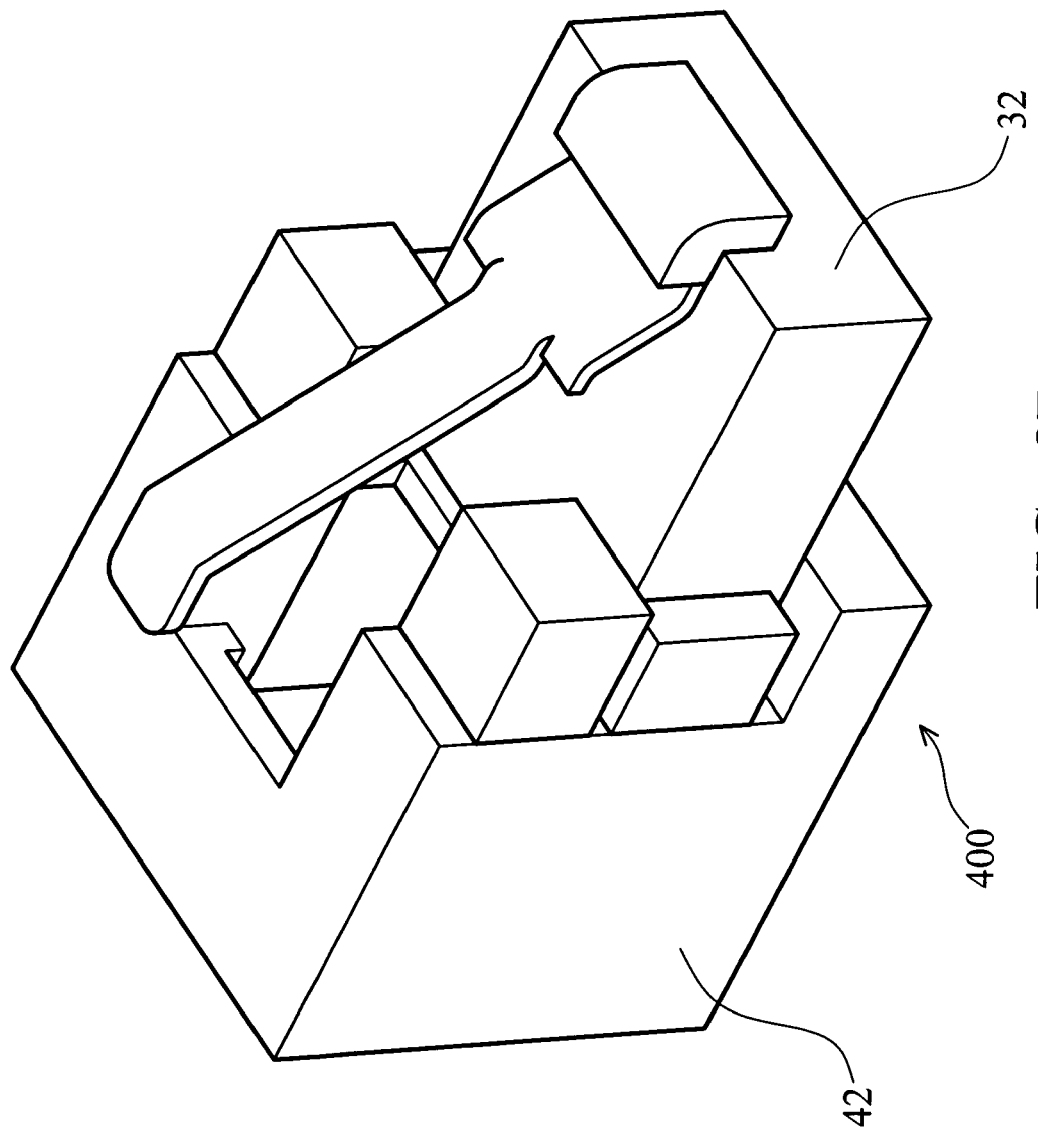

FIGS. 8A and 8B show another embodiment of a connection apparatus. As shown, a connection apparatus 400 comprises a slot 22 and a plug 32, a circuit board (not shown) in a housing 42, in which the circuit board comprises the high voltage impulse protector 26 shown in FIG. 2. The slot 22, the plug 32 and the high voltage impulse protection 26 are electrically coupled by the circuit board, and the high voltage impulse protection 26 is disposed between the pins of the slot 22 and the ground terminal, discharging overcurrent generated by high voltage to the ground terminal by point discharge when a high voltage impulse event occurs. For example, the high voltage impulse protector 26 comprises a conductive layer CM with a plurality of tips TP aligning with pins of the slot 22 and a capacitor CH coupled between the conductive layer CM and the ground terminal. Operations of the high voltage impulse protector 26 are similar to those described with reference to FIGS. 2~4, thus, further description thereof is omitted for brevity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A connection apparatus, comprising:
    at least one isolation transformer comprising a primary coil and a secondary coil each comprising a first end, a second end and a tap;
    a high voltage impulse protector disposed between the primary coil of the isolation transformer and a ground terminal, discharging an overcurrent caused by a high voltage impulse to the ground terminal by point discharge when a high voltage impulse event occurs; and
    a slot disposed on a circuit board, wherein the slot comprises a plurality of pins coupling to the first end or the second end of the primary coil and the high voltage impulse protector comprises a plurality of tips aligning with the pins of the slot without directly connecting.

2. The connection apparatus as claimed in claim 1, further comprising at least one transient voltage suppression unit performing a high voltage impulse protection between signal lines.

3. The connection apparatus as claimed in claim 2, wherein the transient voltage suppression unit comprises transient voltage suppressor (TVS) diodes, polydiodes, surge absorbers or varistors.

4. The connection apparatus as claimed in claim 1, wherein the connection apparatus comprises two isolation transformers and two transient voltage suppression units in which one of the transient voltage suppression units is coupled between taps of the primary coils in the two isolation transformers and the other is coupled between taps of the secondary coils in the two isolation transformers.

5. The connection apparatus as claimed in claim 1, wherein the high voltage impulse protector does not electrically couple to the pins of the slot when no high voltage impulse event and discharges overcurrent caused by the high voltage impulse to the ground terminal by point discharge when occurring the high voltage impulse event.

6. The connection apparatus as claimed in claim 1, wherein the high voltage impulse protector comprises:
    a conductive layer comprising the plurality of tips aligning the pins of the slot; and
    a capacitor coupled between the conductive layer and the ground terminal.

7. The connection apparatus as claimed in claim 6, wherein the conductive layer is disposed in or on the circuit board.

8. The connection apparatus as claimed in claim 1, wherein the connection apparatus is disposed on a local area network (LAN) card or on a motherboard.

9. The connection apparatus as claimed in claim 1, wherein the connection apparatus is a network connector.

10. A connection apparatus, comprising:
    a socket comprising a slot disposed on a circuit board and the slot having a plurality of pins; and
    a high voltage impulse protector disposed between the pins of the slot and a ground terminal, discharging an overcurrent generated by a high voltage impulse to the ground terminal by point discharge when a high voltage impulse event occurs, wherein the high voltage impulse protector comprises a conductive layer comprising the plurality of tips aligning the pins of the slot and a capacitor coupled between the conductive layer and the ground terminal.

11. The connection apparatus as claimed in claim 10, wherein the high voltage impulse protector does not electrically couple to the pins of the slot when no high voltage impulse event.

12. The connection apparatus as claimed in claim 10, wherein the connection apparatus is a network connector.

13. The connection apparatus as claimed in claim 10, further comprising a plug electrically coupled to the socket.

14. A high voltage impulse protection method for a connection apparatus comprising a slot disposed on a circuit board, in which the slot has a plurality of pins, and the method comprising:

disposing a high voltage impulse protector between the pins of the slot and a ground terminal to discharge an overcurrent caused by a high voltage impulse to the ground terminal by point discharge when a high voltage impulse event occurs, wherein the high voltage impulse protector comprises a plurality of tips aligning with the pins of the slot without connecting directly.

15. The method as claimed in claim 14, wherein the connection apparatus further comprises at least one isolation transformer comprising a primary coil and a secondary coil each comprising a first end, a second end and a tap, and the first and second ends of the isolation transformer are electrically coupled to a corresponding pin of the slot respectively.

16. The method as claimed in claim 15, further comprising disposing a first transient voltage suppression unit between taps of the primary coils of two isolation transformers, and a second suppression unit between taps of the secondary coils of the two isolation transformers, performing a high voltage impulse protection between signal lines.

17. The method as claimed in claim 14, wherein the high voltage impulse protector comprises a conductive layer having the tips aligning with the pins of the slot.

18. The method as claimed in claim 17, wherein the conductive layer is disposed in or on the circuit board.

19. The method as claimed in claim 17, further comprising disposing a capacitor between the conductive layer and the ground terminal.

* * * * *